United States Patent
Koga et al.

(10) Patent No.: US 10,014,241 B2
(45) Date of Patent: Jul. 3, 2018

(54) SEMICONDUCTOR DEVICE

(71) Applicant: ROHM CO., LTD., Kyoto (JP)

(72) Inventors: Akihiro Koga, Kyoto (JP); Taro Nishioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/856,021

(22) Filed: Dec. 27, 2017

(65) Prior Publication Data

US 2018/0122726 A1 May 3, 2018

Related U.S. Application Data

(60) Continuation of application No. 15/449,117, filed on Mar. 3, 2017, now Pat. No. 9,887,150, which is a
(Continued)

(30) Foreign Application Priority Data

Dec. 22, 2008 (JP) .................. 2008-326113

(51) Int. Cl.
*H01L 23/495* (2006.01)
*H01L 23/31* (2006.01)
(Continued)

(52) U.S. Cl.
CPC ...... *H01L 23/49548* (2013.01); *H01L 23/293* (2013.01); *H01L 23/3107* (2013.01); *H01L 23/3114* (2013.01); *H01L 23/49* (2013.01); *H01L 23/4952* (2013.01); *H01L 23/49503* (2013.01); *H01L 23/49541* (2013.01); *H01L 24/42* (2013.01); *H01L 24/48* (2013.01);
(Continued)

(58) Field of Classification Search
CPC .......... H01L 23/3107; H01L 23/49548; H01L 2224/32057; H01L 24/32; H01L 2924/181; H01L 2224/48091; H01L 2224/05599; H01L 23/49503; H01L 23/49805; H01L 23/4952; H01L 23/49541; H01L 23/495
See application file for complete search history.

(56) References Cited

U.S. PATENT DOCUMENTS

| 5,550,402 | A | 8/1996 | Nicklaus |
| 7,741,704 | B2 | 6/2010 | Lange et al. |
| | | (Continued) | |

FOREIGN PATENT DOCUMENTS

| JP | H06-236958 A | 8/1994 |
| JP | H08-222663 A | 8/1996 |
| | (Continued) | |

*Primary Examiner* — Jasmine Clark
(74) *Attorney, Agent, or Firm* — Rabin & Berdo, P.C.

(57) ABSTRACT

A semiconductor device is disclosed. The semiconductor device has a semiconductor chip, an island having an upper surface to which the semiconductor chip is bonded, a lead disposed around the island, a bonding wire extended between the surface of the semiconductor chip and the upper surface of the lead, and a resin package sealing the semiconductor chip, the island, the lead, and the bonding wire, while the lower surface of the island and the lower surface of the lead are exposed on the rear surface of the resin package, and the lead is provided with a recess concaved from the lower surface side and opened on a side surface thereof.

30 Claims, 4 Drawing Sheets

Related U.S. Application Data continuation of application No. 15/093,825, filed on Apr. 8, 2016, now Pat. No. 9,607,932, which is a continuation of application No. 14/637,565, filed on Mar. 4, 2015, now Pat. No. 9,337,128, which is a continuation of application No. 14/257,217, filed on Apr. 21, 2014, now Pat. No. 9,035,436, which is a continuation of application No. 13/930,670, filed on Jun. 28, 2013, now Pat. No. 8,742,552, which is a division of application No. 13/141,222, filed as application No. PCT/JP2009/006548 on Dec. 2, 2009, now Pat. No. 8,502,359.

(51) Int. Cl.
*H01L 23/48* (2006.01)
*H01L 23/29* (2006.01)
*H01L 23/49* (2006.01)
*H01L 23/00* (2006.01)

(52) U.S. Cl.
CPC ............ *H01L 24/49* (2013.01); *H01L 24/32* (2013.01); *H01L 2224/05599* (2013.01); *H01L 2224/32245* (2013.01); *H01L 2224/48091* (2013.01); *H01L 2224/48106* (2013.01); *H01L 2224/48177* (2013.01); *H01L 2224/48247* (2013.01); *H01L 2224/49* (2013.01); *H01L 2224/73265* (2013.01); *H01L 2924/01004* (2013.01); *H01L 2924/1715* (2013.01); *H01L 2924/181* (2013.01)

(56) References Cited

U.S. PATENT DOCUMENTS

| | | | |
|---|---|---|---|
| 7,821,113 | B2 | 10/2010 | Sahasrabudhe et al. |
| 8,253,238 | B2* | 8/2012 | Satoh .................. H01L 21/4842 |
| | | | 257/676 |
| 8,502,359 | B2 | 8/2013 | Koga et al. |
| 9,035,436 | B2 | 5/2015 | Koga et al. |
| 9,337,128 | B2 | 5/2016 | Koga et al. |
| 2002/0149099 | A1 | 10/2002 | Shirasaka et al. |
| 2002/0177256 | A1 | 11/2002 | Lee |
| 2005/0106783 | A1 | 5/2005 | Miyata |
| 2005/0260795 | A1 | 11/2005 | Park et al. |
| 2006/0110857 | A1 | 5/2006 | Miyata |
| 2007/0001275 | A1 | 1/2007 | Shirasaka et al. |

FOREIGN PATENT DOCUMENTS

| | | |
|---|---|---|
| JP | 2001-015668 A | 1/2001 |
| JP | 2003-218284 A | 7/2003 |
| JP | 2005-150629 A | 6/2005 |
| JP | 2007-095788 A | 4/2007 |

* cited by examiner

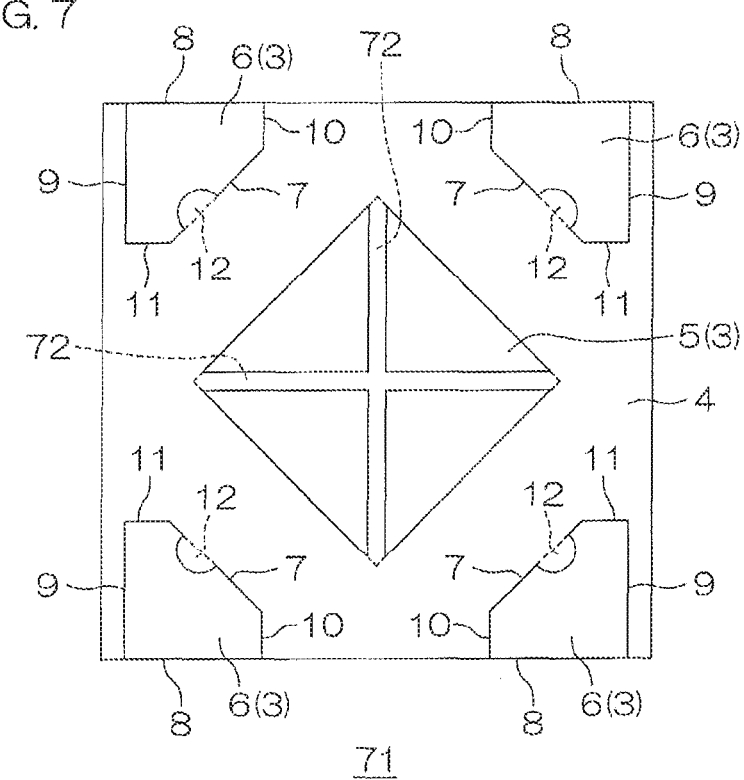

SEMICONDUCTOR DEVICE

CROSS REFERENCE TO RELATED APPLICATION

This application is a continuation of application Ser. No. 15/449,117, filed on Mar. 3, 2017, and allowed on Sep. 26, 2017, followed by a continuation application Ser. No. 15/629,243, now U.S. Pat. No. 9,793,195, issued on Oct. 17, 2017, both of which were a continuation of application Ser. No. 15/093,825, filed on Apr. 8, 2016, now U.S. Pat. No. 9,607,932, issued on Mar. 28, 2017, which was a continuation of application Ser. No. 14/637,565, filed on Mar. 4, 2015, now U.S. Pat. No. 9,337,128, issued on May 10, 2016, which was a continuation of application Ser. No. 14/257, 217, filed on Apr. 21, 2014, now U.S. Pat. No. 9,035,436, issued on May 19, 2015, which was a continuation of application Ser. No. 13/930,670, filed on Jun. 28, 2013, now U.S. Pat. No. 8,742,552, issued on Jun. 3, 2014, which was a divisional of application Ser. No. 13/141,222, filed on Sep. 1, 2011, now U.S. Pat. No. 8,502,359, issued on Aug. 6, 2013, which was a National Stage of the International Application No. PCT/JP2009/006548, filed on Dec. 2, 2009. Furthermore, this application claims the benefit of priority of Japanese application 2008-326113, filed on Dec. 22, 2008. The disclosures of these prior U.S. and Japanese applications are incorporated herein by reference.

TECHNICAL FIELD

The present invention relates to a surface-mounted semiconductor device.

BACKGROUND TECHNIQUE

The so-called non-leaded package eliminating extension of leads from a resin package and exposing the leads (outer leads) on the lower surface of the resin package is known as a surface mount package.

A semiconductor device employing the non-leaded package has a structure obtained by sealing a semiconductor chip with a resin package along with a lead frame. The lead frame is formed by punching a thin metal plate, and includes an island and a plurality of leads arranged around the island. The semiconductor chip is die-bonded to the upper surface of the island, and electrically connected with each lead by a bonding wire extended between the surface thereof and the upper surface of each lead. The lower surfaces of the island and each lead are exposed on the rear surface of the resin package.

PRIOR ART

Patent Document

Patent Document 1: Japanese Unexamined Patent Publication No. 2007-95788

SUMMARY OF THE INVENTION

Problem to be Solved by the Invention

In such a structure, each lead is held in the resin package only by bonding power between the upper surface and side surfaces thereof and the resin package. Therefore, the lead may come off the resin package.

Accordingly, an object of the present invention is to provide a surface-mounted semiconductor device capable of attaining improvement in bonding strength between a lead and a resin package.

Means for Solving the Problem

A semiconductor device according to the present invention for attaining the aforementioned object includes a semiconductor chip, an island having an upper surface to which the semiconductor chip is bonded, a lead arranged around the island, a bonding wire extended between the surface of the semiconductor chip and the upper surface of the lead, and a resin package collectively sealing the semiconductor chip, the island, the lead and the bonding wire, while the lower surface of the island and the lower surface of the lead are exposed on the rear surface of the resin package, and the lead is provided with a recess concaved from the lower surface side and opened on a side surface thereof.

In the semiconductor device, the lower surfaces of the island to which the semiconductor chip is bonded (die-bonded) and the lead electrically connected with the semiconductor chip by the bonding wire are exposed on the rear surface of the resin package collectively sealing the same. Therefore, the semiconductor device is surface-mountable on a wiring board.

The lead is provided with the recess concaved from the lower surface side thereof and opened on the side surface. The material for the resin package infiltrates into the recess, whereby part of a peripheral edge portion of the lead is held by the resin package from both of the upper and lower sides thereof. Thus, improvement in bonding strength between the lead and the resin package can be attained. Consequently, the lead can be prevented from coming off the resin package.

Preferably, the recess has a portion arcuately shaped in bottom plan view. According to this structure, the bonding strength between the lead and the resin package in all radial directions of the arcuate shape can be increased.

When, in a case of such a structure that a side surface of the lead is exposed on a side surface of the resin package, the recess is formed to be opened on the exposed side surface, for example, it is apprehended that the recess is blocked by a molding die for formation of the resin package and the material for the resin package does not infiltrate into the recess.

Therefore, the recess is preferably opened on a side surface of the lead opposed to the island. Thus, the recess is not blocked by the molding die and hence the material for the resin package can be reliably infiltrated into the recess, whereby the bonding strength between the lead and the resin package can be reliably improved.

The island may be quadrangularly shaped in bottom plan view, and the lead may be arranged on a portion opposed to each of four sides of the island in plan view, and provided in a shape having a side parallel to the opposed side. In this case, the recess is preferably opened on a side surface of each lead having a side opposed to each side of the island. Thus, the material for the resin package can be reliably infiltrated into the recess of each lead, whereby the bonding strength between each lead and the resin package can be reliably improved.

Preferably, the area of the recess in bottom plan view is not more than half the total area of the lower surface of the lead. With such a size of the recess, the bonding wire can be bonded to a relatively thick portion of the lead, while improvement in bonding strength between the lead and the resin package can be attained. Further, a contact area of the lead with respect to a wiring board can be sufficiently ensured.

Preferably, the lead has a side surface exposed on a side surface of the resin package, and a portion of the lead along the exposed side surface is provided with a recessed groove concaved from the lower surface side of the lead over the total width in a direction along the side surface. The material for the resin package also infiltrates into the recessed groove, whereby further improvement in bonding strength between the lead and the resin package can be attained.

BRIEF DESCRIPTION OF THE DRAWINGS

FIG. 7 is a bottom plan view of a semiconductor device according to a sixth embodiment of the present invention.

MODE FOR CARRYING OUT THE INVENTION

Embodiments of the present invention are now described in detail with reference to the attached drawings.

Figure 1:
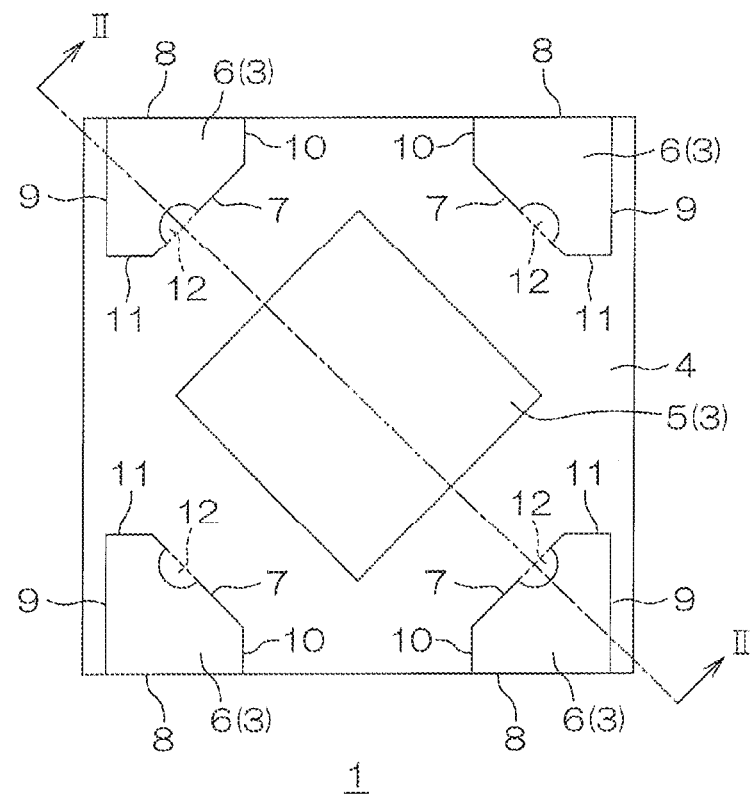
FIG. 1 is a bottom plan view of a semiconductor device according to a first embodiment of the present invention.
Figure 2:
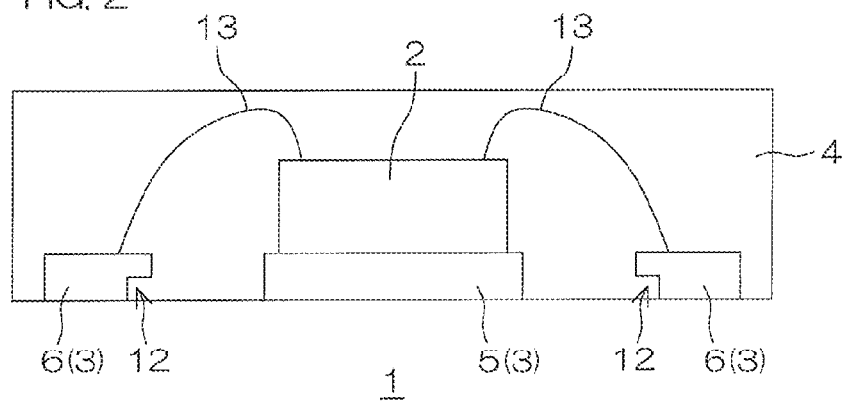
FIG. 2 is a schematic sectional view of the semiconductor device shown in FIG. 1 taken along a cutting plane line II-II.

FIG. 1 is a bottom plan view of a semiconductor device according to a first embodiment of the present invention. FIG. 2 is a schematic sectional view of the semiconductor device shown in FIG. 1 taken along a cutting plane line II-II.

A semiconductor device 1 has a structure obtained by sealing a semiconductor chip 2 with a resin package 4 along with a lead frame 3. The contour of the semiconductor device 1 is in the shape of a flat rectangular parallelepiped (a hexahedron square-shaped in plan view according to the embodiment).

The lead frame 3 is formed by punching a thin metal plate (a thin copper plate, for example), and includes an island 5 and four leads 6 arranged around the island 5.

The island 5 is quadrangularly shaped in plan view (square-shaped in plan view according to the embodiment). The lower surface of the island 5 is exposed on the rear surface of the resin package 4.

The leads 6 are arranged on portions opposed to the four sides of the island 5 respectively in bottom plan view. Each lead 6 is trapezoidally shaped in bottom plan view. More specifically, each lead 6 is provided in a shape having a side 7 parallel to the opposed side of the island 5, a side 8 extending on a side surface of the resin package 4, a side 9 orthogonal to the side 8 and extending parallelly to another side surface of the resin package 4, and sides 10 and 11 connecting the side 7 with the sides 8 and 9 respectively in plan view.

Each lead 6 is provided with a recess 12, semicircularly shaped in bottom plan view, concaved from the side of the lower surface (the exposed surface) of the lead 6 and opened on a side surface opposed to the island 5, i.e., the side surface having the side 7. The material for the resin package 4 infiltrates into the recess 12. The recess 12 can be formed by chemical etching or crushing, for example.

The lower surface of each lead 6 is exposed on the rear surface of the resin package 4 except the recess 12, to function as an external terminal for connection with a wiring board (not shown). The side surface of each lead 6 having the side 8 is exposed on the corresponding side surface of the resin package 4.

The rear surface of the semiconductor chip 2 is bonded (die-bonded) to the island 5 through a conductive bonding agent, in a state upwardly directing a surface (a device forming surface) on a side provided with functional elements. On the surface of the semiconductor chip 2, a pad (not shown) is formed by exposing part of a wiring layer from a surface protective film, correspondingly to each lead 6. An end of a bonding wire 13 is bonded to each pad. Another end of the bonding wire 13 is bonded to the upper surface of a relatively thick portion (a portion not provided with the recess 12) in each lead 6. Thus, the semiconductor chip 2 is electrically connected with the lead 6 through the bonding wire 13.

As hereinabove described, the lower surfaces of the island 5 and the leads 6 are exposed on the rear surface of the resin package 4. Therefore, the semiconductor device 1 is surface-mountable on the wiring board.

Each lead 6 is provided with the recess 12 concaved from the lower surface side thereof and opened on the side surface having the side 7. The material for the resin package 4 infiltrates into the recess 12, whereby the portion of each lead 6 provided with the recess 12 is held by the resin package 4 from both of the upper and lower sides thereof. Thus, improvement in bonding strength between each lead 6 and the resin package 4 can be attained. Consequently, the lead 6 can be prevented from coming off the resin package 4.

The recess 12 is opened on the side surface having the side 7, whereby the material for the resin package 4 can be reliably infiltrated into the recess 12.

Further, the recess 12 is semicircularly shaped in bottom plan view, whereby the bonding strength between the lead 6 and the resin package 4 in all radial directions of the arc thereof can be increased.

Figure 3:
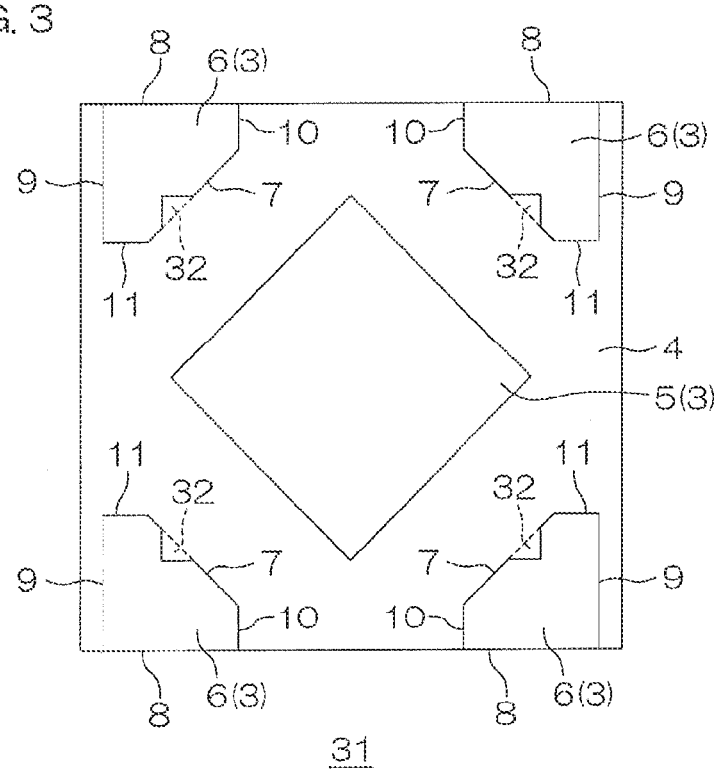
FIG. 3 is a bottom plan view of a semiconductor device according to a second embodiment of the present invention.

FIG. 3 is a bottom plan view of a semiconductor device according to a second embodiment of the present invention. Referring to FIG. 3, portions corresponding to those shown in FIG. 1 are denoted by the same reference signs as those assigned to the portions. In the following, only a point different from the structure shown in FIG. 1 is described as to the structure shown in FIG. 3, and description of the portions denoted by the same reference signs is omitted.

In a semiconductor device 31 shown in FIG. 3, each lead 6 is provided with a recess 32, right-triangularly shaped in bottom plan view, concaved from the lower surface side thereof and opened on a side surface having a side 7. The material for a resin package 4 infiltrates into the recess 32. The recess 32 can be formed by chemical etching or crushing, for example.

Also in this structure, improvement in bonding strength between each lead 6 and the resin package 4 can be attained. Consequently, the lead 6 can be prevented from coming off the resin package 4.

Figure 4:
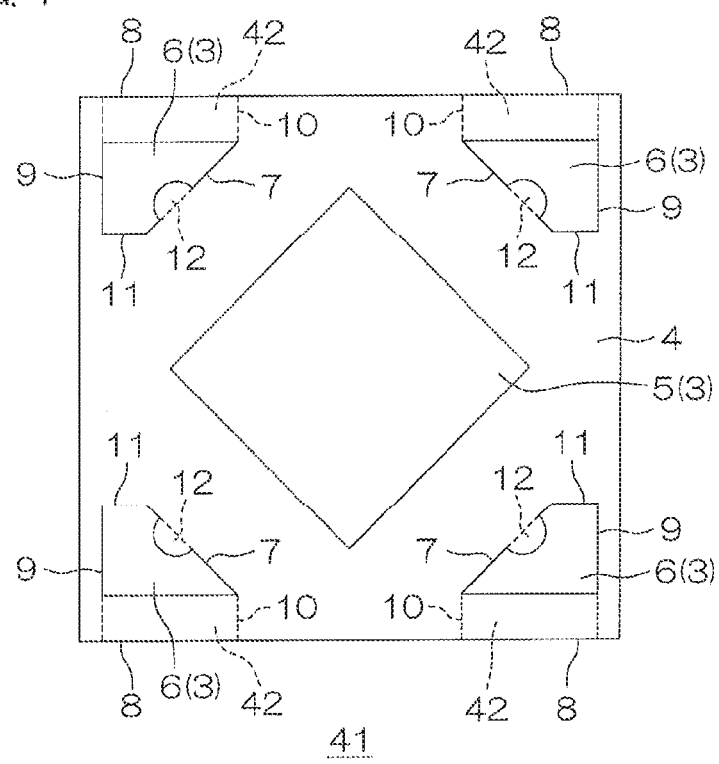
FIG. 4 is a bottom plan view of a semiconductor device according to a third embodiment of the present invention.

FIG. 4 is a bottom plan view of a semiconductor device according to a third embodiment of the present invention. Referring to FIG. 4, portions corresponding to those shown in FIG. 1 are denoted by the same reference signs as those assigned to the portions. In the following, only a point different from the structure shown in FIG. 1 is described as to the structure shown in FIG. 4, and description of the portions denoted by the same reference signs is omitted.

In a semiconductor device 41 shown in FIG. 4, a portion of each lead 6 having a side 8 is provided with a recessed groove 42 concaved from the lower surface side of each lead 6 over the total width in a direction along the side 8.

According to this structure, the material for a resin package 4 infiltrates into a recess 12 and the recessed groove 42, whereby further improvement in bonding strength between each lead 6 and the resin package 4 can be attained.

Figure 5:
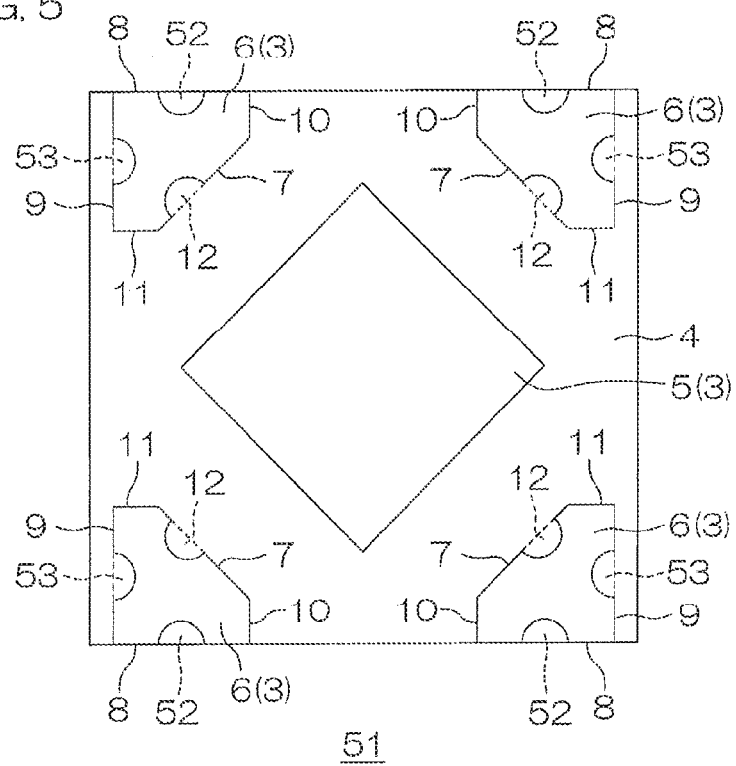
FIG. 5 is a bottom plan view of a semiconductor device according to a fourth embodiment of the present invention.

FIG. 5 is a bottom plan view of a semiconductor device according to a fourth embodiment of the present invention. Referring to FIG. 5, portions corresponding to those shown in FIG. 1 are denoted by the same reference signs as those assigned to the portions. In the following, only a point different from the structure shown in FIG. 1 is described as to the structure shown in FIG. 5, and description of the portions denoted by the same reference signs is omitted.

In a semiconductor device 51 shown in FIG. 5, each lead 6 is provided with recesses 12, 52 and 53, semicircularly shaped in bottom plan view, concaved from the lower surface side thereof and opened on side surfaces having sides 7, 8 and 9 respectively.

According to this structure, the material for a resin package 4 infiltrates into the recesses 12, 52 and 53, whereby further improvement in bonding strength between each lead 6 and the resin package 4 can be attained.

Figure 6:
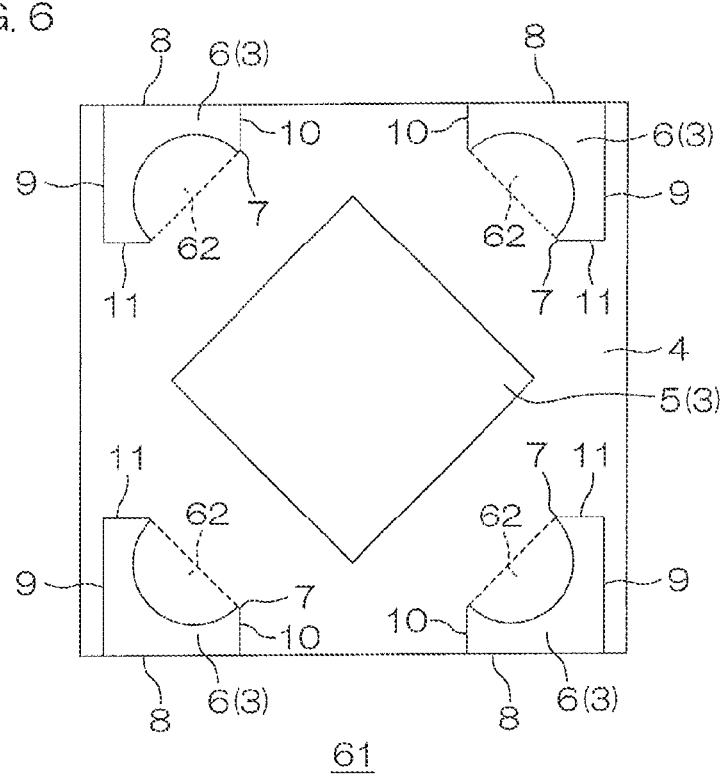
FIG. 6 is a bottom plan view of a semiconductor device according to a fifth embodiment of the present invention.

FIG. 6 is a bottom plan view of a semiconductor device according to a fifth embodiment of the present invention. Referring to FIG. 6, portions corresponding to those shown in FIG. 1 are denoted by the same reference signs as those assigned to the portions. In the following, only a point different from the structure shown in FIG. 1 is described as to the structure shown in FIG. 6, and description of the portions denoted by the same reference signs is omitted.

In a semiconductor device 61 shown in FIG. 6, each lead 6 is provided with a recess 62, semicircularly shaped in bottom plan view, having a size larger than that of the recess 12 shown in FIG. 1. The recess 62 is concaved from the lower surface side thereof, and opened on a side surface having a side 7. The area of the recess 62 in bottom plan view is about half the total area of the lower surface of the lead 6.

When the area of the recess 62 in bottom plan view is not more than half the total area of the lower surface of the lead 6, a bonding wire 13 can be bonded to a relatively thick portion of the lead 6, while improvement in bonding strength between the lead 6 and a resin package 4 can be attained. Further, a contact area of the lead 6 with respect to a wiring board can be sufficiently ensured.

FIG. 7 is a bottom plan view of a semiconductor device according to a sixth embodiment of the present invention. Referring to FIG. 7, portions corresponding to those shown in FIG. 1 are denoted by the same reference signs as those assigned to the portions. In the following, only a point different from the structure shown in FIG. 1 is described as to the structure shown in FIG. 7, and description of the portions denoted by the same reference signs is omitted.

In a semiconductor device 71 shown in FIG. 7, an island 5 is provided with groovelike recesses 62 concaved from the lower surface side thereof and extending along two diagonal lines of the island 5 in bottom plan view. The material for a resin package 4 infiltrates into the recesses 72. The recesses 72 can be formed by chemical etching or crushing, for example.

The material for the resin package 4 infiltrates into the recesses 72, whereby portions of the island 5 provided with the recesses 72 are held by the resin package 4 from both of the upper and lower sides thereof. Thus, improvement in bonding strength between the island 5 and the resin package 4 can be attained. Consequently, the island 5 can be prevented from coming off the resin package 4.

While the first to sixth embodiments of the present invention have been described, the first to sixth embodiments may be properly combined and executed. For example, the first embodiment and the fourth embodiment may be so combined that one or two of the three recesses 12, 52 and 53 shown in FIG. 5 are semicircularly shaped in bottom plan view and the rest is right-triangularly shaped in bottom plan view. Further, the second embodiment and the third embodiment may be so combined that each lead 6 is provided with the recess 32 right-triangularly shaped in bottom plan view shown in FIG. 3 and the recessed groove 42 shown in FIG. 4.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The invention claimed is:

1. A semiconductor device comprising:
   a semiconductor chip having an upper surface and a lower surface;
   an island having a lower surface, and an upper surface to which the semiconductor chip is bonded, the island further comprises a first, a second, a third, and a fourth island side in a bottom plan view;
   a plurality of leads arranged around the island;
   for each lead of the plurality of leads, a bonding wire extending between the upper surface of the semiconductor chip and an upper surface of the lead; and
   a resin package sealing the semiconductor chip, the island, the plurality of leads and the bonding wires, the resin package having four package sides in the bottom plan view and four package corners;
   wherein the plurality of leads on a lower surface of the resin package are configured to allow the semiconductor device to be surface mounted;
   wherein, in the bottom plan view, the island comprises the four island sides, each of which is not parallel to any of the four package sides of the resin package, and for the first, the second, and the third island sides of the island, the angle between these island sides and any of the four package sides of the resin package is less than a perpendicular angle and each of the first, the second, and the third island sides of the island faces a respective and different one of the package corners;
   wherein at least two of the plurality of leads are arranged at two of the respective package corners in bottom plan view;
   wherein each of the plurality of leads has a side facing a respective one of the four island sides of the island, the side of the lead and the respective island side of the island forming a facing pair of sides; and
   wherein one of the facing pairs of sides includes both the fourth island side and a recess portion such that at least a portion of the fourth island side of the island and at least a portion of the recess portion are non-parallel.

2. The semiconductor device of claim 1, wherein the four island sides are respectively connected at and define four island corners; wherein four leads of the plurality of leads are arranged at respective package corners in the bottom plan view; and
   wherein disposed in between each pair of the four leads is a single different one of the four island corners.

3. The semiconductor device of claim 1, wherein the recess portion is formed at a position apart from a corner of at least one of the leads.

4. The semiconductor device of claim 1, wherein the recess portion is arcuately shaped in the bottom plan view.

5. The semiconductor device of claim 1, wherein the recess portion includes a portion infiltrated by the resin package.

6. The semiconductor device of claim 1, wherein the recess portion comprises a concave portion having a curvature that faces one of the package corners.

7. The semiconductor device of claim 1, wherein the recess portion comprises a concave portion in the bottom plan view.

8. The semiconductor device of claim 1, wherein the recess portion is disposed at approximately a center of one of the sides of the one of the facing pairs of sides.

9. The semiconductor device of claim 1, wherein the recess portion is disposed in the side of the lead facing the fourth island side of the one of the facing pairs of sides.

10. A semiconductor device comprising:
a semiconductor chip having an upper surface and a lower surface;
an island having a lower surface, and an upper surface, the semiconductor chip being bonded to the upper surface of the island, the island further comprising a first, a second, a third, and a fourth island side in a bottom plan view, the island further comprising four island corners;
four leads disposed around the island;
for each lead of the four leads, a bonding wire extending between the upper surface of the semiconductor chip and an upper surface of the lead; and
a resin package sealing the semiconductor chip, the island, the four leads, and bonding wires; the resin package having four package corners;
wherein at least one lead of the four leads on a lower surface of the resin package is adapted to allow the semiconductor device to be surface mounted;
wherein, in the bottom plan view, the first, the second, and the third island sides of the island are not parallel to any of the four package sides;
wherein a diagonal island line connecting two of the island corners forms an angle of approximately 45 degrees with respect to a diagonal package line connecting two of the package corners, where the diagonal island line is not any of the island sides and the diagonal package line is not any of the package sides;
wherein each one of the four leads is disposed at a different one of the package corners in the bottom plan view;
wherein a side of each one of the four leads faces a different one of the four island sides; and
wherein at least the fourth island side of the four island sides and at least the side of one of the four leads that face each other form a facing portion; and wherein the facing portion includes a recess such that a portion of at least the fourth island side of the four island sides and at least a portion of the recess are non-parallel.

11. The semiconductor device of claim 10, wherein the four island sides are respectively connected at the four island corners; wherein the four leads are arranged at the respective package corners in the bottom view; and wherein each one of the four island corners is disposed in between a different pair of the four leads.

12. The semiconductor device of claim 11, wherein each one of the four island corners is further disposed a first distance from a most proximate one of the four package sides of the resin package, which first distance is less than a second distance from the most proximate one of the four package sides to a most distal point of either of the associated pair of leads.

13. The semiconductor device of claim 10, wherein the recess is arcuately shaped in the bottom plan view.

14. The semiconductor device of claim 10, wherein the recess comprises an arcuate shape.

15. The semiconductor device of claim 10, wherein the recess comprises a concave portion having a curvature that faces one of the package corners.

16. The semiconductor device of claim 10, wherein the recess comprises a concave portion in the bottom plan view.

17. The semiconductor device of claim 10, wherein the recess is disposed in the side of the one lead of the four leads that faces the fourth island side.

18. A semiconductor device comprising:
a semiconductor chip;
an island having an upper surface to which the semiconductor chip is bonded, the island comprising a first, a second, a third, and a fourth island side;
a plurality of leads arranged around the island;
a bonding wire extending between the surface of the semiconductor chip and an upper surface of one of the plurality of leads; and
a resin package sealing the semiconductor chip, the island, the plurality of leads and the bonding wire, the resin package comprising a rear surface, four package sides, and four package corners, each package corner formed at an intersection of respective first and second adjacent package sides;
wherein a lower surface of the island and lower surfaces of the plurality of leads are exposed on the rear surface of the resin package;
wherein the four island sides are connected respectively at and defining four island corners, wherein at least the second, the third, and the fourth island sides face a respective one of the package corners and do not face any of the package sides of the resin package;
wherein the plurality of leads includes four leads, each one of the four leads being arranged at a respective one of the four package corners in a bottom plan view;
wherein each of the plurality of leads has a first side which is approximately along the respective first adjacent package side of the nearest respective package corner of the resin package in the bottom plan view;
wherein each of the leads has a second side which is facing the respective second adjacent package side of the nearest respective package corner of the resin package in the bottom plan view;
wherein each of the leads has the first side of the lead and the second side of the lead connected to each other in the bottom plan view;
wherein at least a portion of a side surface of the first side of one of the leads is exposed on a side surface of the respective first adjacent package side of the nearest respective package corner of the resin package;
wherein the second side of the one of the leads is spaced a distance from the respective second adjacent package side of the nearest respective package corner of the resin package in the bottom plan view;
wherein each of the leads has a third side which is non-parallel with each of the package sides of the resin package in the bottom plan view;
wherein each of the third sides of the leads is facing a respective one of the four sides of the island in the bottom plan view; and wherein the semiconductor device further comprises a facing portion including the first side of the island and one of the third sides of the leads facing each other.

19. The semiconductor device of claim 18, wherein each one of the four island corners is disposed in between a different pair of leads of the plurality of leads.

20. The semiconductor device of claim 19, wherein each one of the four island corners is further disposed a first distance from a most proximate one of the four package sides of the resin package, which first distance is less than a second distance from the respective most proximate one of the four package sides to a most distal point of either of the associated respective pair of leads.

21. The semiconductor device of claim 18, wherein the facing portion includes a recess portion comprising a non-parallel portion that is not parallel to the first side of the island or to the one of the third sides of the leads.

22. The semiconductor device of claim 21, wherein the recess portion is formed at a position apart from a corner of the facing portion.

23. The semiconductor device of claim 21, wherein the recess portion is arcuately shaped in the bottom plan view.

24. The semiconductor device of claim 21, wherein each of the leads further comprises a fourth side which connects the third side of the lead to the second side of the lead in the bottom plan view.

25. The semiconductor device of claim 24, wherein each of the leads further comprises a fifth side which connects the first side of the lead to the third side of the lead in the bottom plan view.

26. The semiconductor device of claim 18, wherein one of the sides of the facing portion further comprises a recess portion in the bottom plan view.

27. The semiconductor device of claim 26, wherein the recess portion comprises an arcuate shape.

28. The semiconductor device of claim 26, wherein the recess portion comprises a concave portion in the bottom plan view.

29. The semiconductor device of claim 26, wherein the one of the third sides of the leads facing the first side of the island comprises the recess portion.

30. The semiconductor device of claim 25, wherein the first side of the island and one of the third sides of the leads are facing each other so that part of both of the sides are extending parallel approximately.

\* \* \* \* \*